(12) United States Patent
Nittala

(10) Patent No.: US 11,394,394 B1
(45) Date of Patent: Jul. 19, 2022

(54) SIGNAL CHAIN WITH CURRENT OUTPUT GAIN STAGE FOLLOWED BY CURRENT INPUT ADC

(71) Applicant: Analog Devices International Unlimited Company, Limerick (IE)

(72) Inventor: Venkata Aruna Srikanth Nittala, Bengaluru (IN)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/204,207

(22) Filed: Mar. 17, 2021

(51) Int. Cl.
*H03M 3/00* (2006.01)
*H03F 1/26* (2006.01)

(52) U.S. Cl.
CPC .............. *H03M 3/344* (2013.01); *H03F 1/26* (2013.01); *H03M 3/458* (2013.01)

(58) Field of Classification Search
USPC .................................................. 341/143, 155
See application file for complete search history.

(56) References Cited

U.S. PATENT DOCUMENTS

| | | | |
|---|---|---|---|
| 6,753,801 B2* | 6/2004 | Rossi | H03F 3/005 341/172 |
| 6,909,391 B2* | 6/2005 | Rossi | H03F 3/005 341/172 |
| 7,078,964 B2 | 7/2006 | Risbo et al. | |
| 7,205,920 B2 | 4/2007 | Morrow et al. | |
| 7,307,572 B2* | 12/2007 | Garrity | H03M 1/1225 341/172 |
| 8,711,980 B2 | 4/2014 | Oliaei | |
| 8,766,835 B2 | 7/2014 | Hojabri et al. | |
| 8,988,260 B2 | 3/2015 | Kinyua | |
| 9,065,474 B2 | 6/2015 | Bernardinis et al. | |
| 9,438,268 B2 | 9/2016 | Mitani et al. | |
| 9,537,497 B2 | 1/2017 | Ho et al. | |
| 9,608,585 B2* | 3/2017 | Kull | H03M 1/0607 |
| 9,935,598 B2* | 4/2018 | Yao | H03F 3/45475 |
| 10,135,399 B2* | 11/2018 | Carrara | H03F 1/0205 |

(Continued)

FOREIGN PATENT DOCUMENTS

| | | |
|---|---|---|
| DE | 102014200856 B3 | 3/2015 |
| WO | WO-2006034177 A1 | 3/2006 |
| WO | WO-2010119456 A2 | 10/2010 |

OTHER PUBLICATIONS

"Quad Current Input, 20-Bit Analog-to-Digital Converter", Texas Instruments, (2009), 36 pgs.

(Continued)

*Primary Examiner* — Jean B Jeanglaude
(74) *Attorney, Agent, or Firm* — Schwegman Lundberg & Woessner, P.A.

(57) ABSTRACT

A gain stage, such as an amplifier, e.g., an instrumentation amplifier, can receive an input signal and adjust the level of the input signal, e.g., amplify or attenuate. An output voltage of the gain stage can be applied to a subsequent circuit. Using various techniques, a second stage of an instrumentation amplifier, which can include a transconductance stage that converts a current to a voltage that can be applied to an output node of the instrumentation amplifier, can be removed. Removal of such a second stage can allow an output current from the gain stage to be applied directly from a current output node to an input node of a subsequent circuit.

19 Claims, 7 Drawing Sheets

(56) References Cited

U.S. PATENT DOCUMENTS

| | | | |
|---|---|---|---|
| 10,224,951 B2 | 3/2019 | Nittala et al. | |
| 10,439,633 B2 | 10/2019 | Breems et al. | |
| 10,581,446 B1 | 3/2020 | Braswell et al. | |
| 2002/0021176 A1* | 2/2002 | Enriquez | H03F 3/3066 330/257 |
| 2004/0036453 A1* | 2/2004 | Rossi | H03F 3/005 341/161 |
| 2004/0160351 A1* | 8/2004 | Rossi | H03F 3/005 341/161 |
| 2006/0284754 A1* | 12/2006 | Garrity | H03M 1/1225 341/172 |
| 2014/0210553 A1* | 7/2014 | Kull | H03G 3/3042 330/279 |
| 2015/0130483 A1* | 5/2015 | Yao | H03F 3/45475 324/705 |
| 2015/0355242 A1 | 12/2015 | Ozawa | |

OTHER PUBLICATIONS

Shoaei, Omid, "Continuous-Time Delta-Sigma A/D Converters for High Speed Applications", PhD Thesis, Carleton University, (Nov. 29, 1995), 230 pgs.

Sniatala, Pawel, et al., "Fully Differential Sigma-Delta Modulator Structure for Current-Mode Sensors", 2016 International Conference on Signals and Electronic Systems (ICSES), Krakow, Poland, (Sep. 5-7, 2016), 37-40.

\* cited by examiner

US 11,394,394 B1

SIGNAL CHAIN WITH CURRENT OUTPUT GAIN STAGE FOLLOWED BY CURRENT INPUT ADC

FIELD OF THE DISCLOSURE

This document relates generally to integrated circuits and more particularly, but not limited to, gain stage circuits.

BACKGROUND

An input signal can be applied to a gain stage to adjust a level of the input signal. For example, the gain stage can amplify or attenuate the input signal. A gain stage can receive an input voltage and generate an output voltage. For example, an instrumentation amplifier can include three operational amplifiers coupled together in two stages to output a voltage that is an amplified or attenuated version of a received input signal.

The output voltage of the gain stage can be applied to a subsequent circuit. For example, a voltage-based analog-to-digital converter circuit can be coupled with receive the output voltage of the gain stage.

SUMMARY OF THE DISCLOSURE

This disclosure describes various techniques to allow an output current from a gain stage, such as an instrumentation amplifier, to be applied directly from a current output node to an input node of a current input of a subsequent circuit, such as an ADC circuit.

In some aspects, this disclosure is directed to a circuit comprising a gain stage including: an input node to receive an input signal; a first operational amplifier stage coupled between the input node and a current output node, the current output node to provide a current output; a current mirror stage coupled with an output of the first operational amplifier stage, the current output node coupled with the current mirror stage; and an analog-to-digital converter (ADC) circuit having an input node coupled with the current output node of the gain stage, the input node to receive a current input.

In some aspects, this disclosure is directed to a method comprising: receiving an input signal; applying, using a gain stage, a gain to the input signal to adjust a level of the input signal; outputting, using a current output node of the gain stage, a current representing the adjusted input signal; and applying the current representing the adjusted input signal to an input node of an analog-to-digital converter (ADC) circuit having an input node coupled with the current output node of the gain stage, the input node to receive a current input.

In some aspects, this disclosure is directed to a gain stage including: an input node to receive an input signal; a first operational amplifier stage coupled between the input node and a current output node, the current output node to provide a current output; a current mirror stage coupled with an output of the first operational amplifier stage, the current output node coupled with the current mirror stage; a second operational amplifier stage coupled between the current mirror stage and a voltage output node, the voltage output node to provide a voltage output; a first analog-to-digital converter (ADC) circuit having an input node coupled with the current output node of the gain stage, the input node to receive a current input; and a second ADC circuit having a voltage-based input node coupled with the voltage output node of the gain stage.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A gain stage, such as an amplifier, e.g., an instrumentation amplifier, can receive an input signal and adjust the level of the input signal, e.g., amplify or attenuate. An output voltage of the gain stage can be applied to a subsequent circuit. For example, a voltage-based analog-to-digital converter (ADC) circuit can be coupled with receive the output voltage of the gain stage and generate a digital output signal.

The present inventor has recognized the desirability of removing circuitry within the gain stage in order to allow the gain stage to output a current directly to a subsequent circuit. For example, an instrumentation amplifier can include three operational amplifiers coupled together in two stages to output a voltage that is an amplified or attenuated version of a received input signal. Using various techniques of this disclosure, in some examples, the second stage of the instrumentation amplifier, which can include a transconductance stage that converts a current to a voltage that can be applied to an output node of the instrumentation amplifier, can be removed. Removal of such a second stage can allow an output current from the gain stage to be applied directly from a current output node to an input node of a current input ADC circuit, for example.

As an example, continuous-time sigma-delta (CTSD) ADC circuits can be designed to accept current inputs. For example, an input resistor of the CTSD ADC circuits can be removed and replaced by a current input. Removal of the resistor can advantageously improve power efficiency. In some examples, a photodiode can be connected directly to a virtual node of an integrator of the CTSD ADC circuit.

Figure 1:
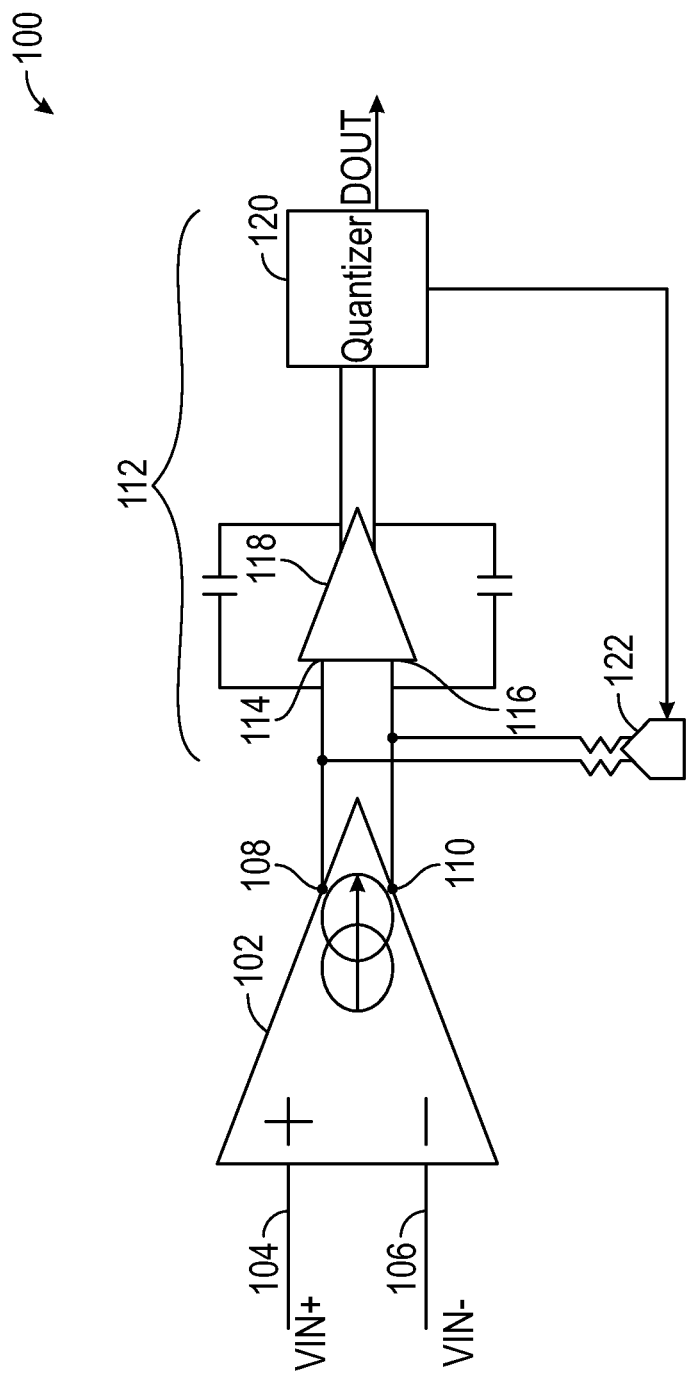
FIG. 1 is a block diagram of an example of a circuit including a gain stage with a current output coupled with a current input ADC circuit using various techniques of this disclosure.

FIG. 1 is a block diagram of an example of a circuit including a gain stage with a current output coupled with a current input ADC circuit using various techniques of this disclosure. The circuit 100 in FIG. 1 can include a gain stage 102. The gain stage 102 can include an amplifier, such as an instrumentation amplifier, having a non-inverting input node 104 and an inverting input node 106. The input nodes 104, 106 can receive an input signal $V_{IN}$, such as from a sensor performing a measurement. The gain stage can apply a gain, e.g., greater than or less than zero, to the input signal to adjust a level of the input signal, e.g., amplifier or attenuate. The circuit 100 can form a signal chain.

Using the techniques of this disclosure, the gain stage can generate a current instead of a voltage at one or more current output nodes, such as at the current output nodes 108, 110. Then, one or more input nodes of a subsequent circuit, such as an ADC circuit 112 can be coupled with the current output node of the gain stage 102 and receive a current input, rather than a voltage input. In some examples, the ADC circuit 112 can be a CTSD ADC circuit, such as shown in FIG. 1, having input nodes 114, 116. The CTSD ADC circuit can include an integrator circuit having an operational amplifier circuit 118 coupled in a feedback configuration using capacitors. In addition, the CTSD ADC circuit can include a quantizer circuit 120 and a digital-to-analog converter (DAC) circuit 122, such as a current DAC or resistive DAC. The ADC circuit 112 can generate a digital output DOUT that represents the analog input signal.

In some existing techniques, gain stages can include three operational amplifiers coupled together in two stages to output a voltage that is an amplified or attenuated version of a received input signal. In addition, a resistor can be coupled with the inputs of the CTSD ADC circuit. Using various techniques of this disclosure, the resistor that is coupled with the inputs of the CTSD ADC circuit can be removed and the second operational amplifier stage of the gain stage can also be removed such that a current that is output by the gain stage 102 can be applied directly to the inputs of the CTSD ADC circuit, which can provide a power advantage over the existing techniques. In addition, removal of the second operational amplifier stage of the gain stage can advantageously reduce the area of the circuit. Further, the first operational amplifier stage can still be a high-voltage stage, e.g., 60 VDC, coupled directly to an CTSD ADC circuit, for example.

Figure 4:
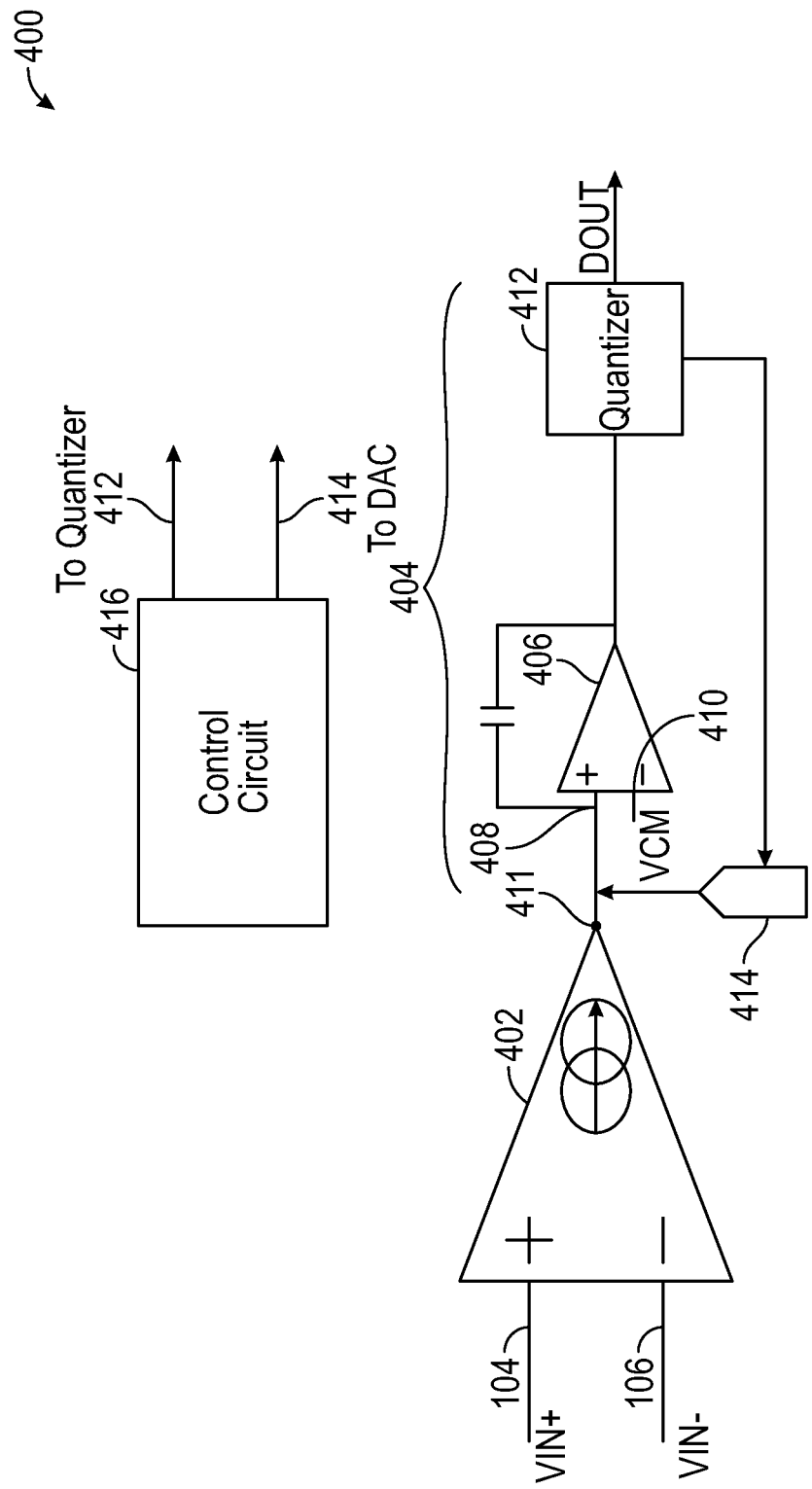
FIG. 4 is a block diagram of another example of a circuit including a gain stage with a current output coupled with a current input ADC circuit using various techniques of this disclosure.

In some examples, the gain stage 102 and the ADC circuit 112 can be arranged in a differential configuration, such as shown in FIG. 1. Differential configurations can include fully differential or pseudo-differential configurations. In other examples, the gain stage and the ADC circuit can be arranged in a single-ended configuration, such as shown in FIG. 4.

Figure 2:
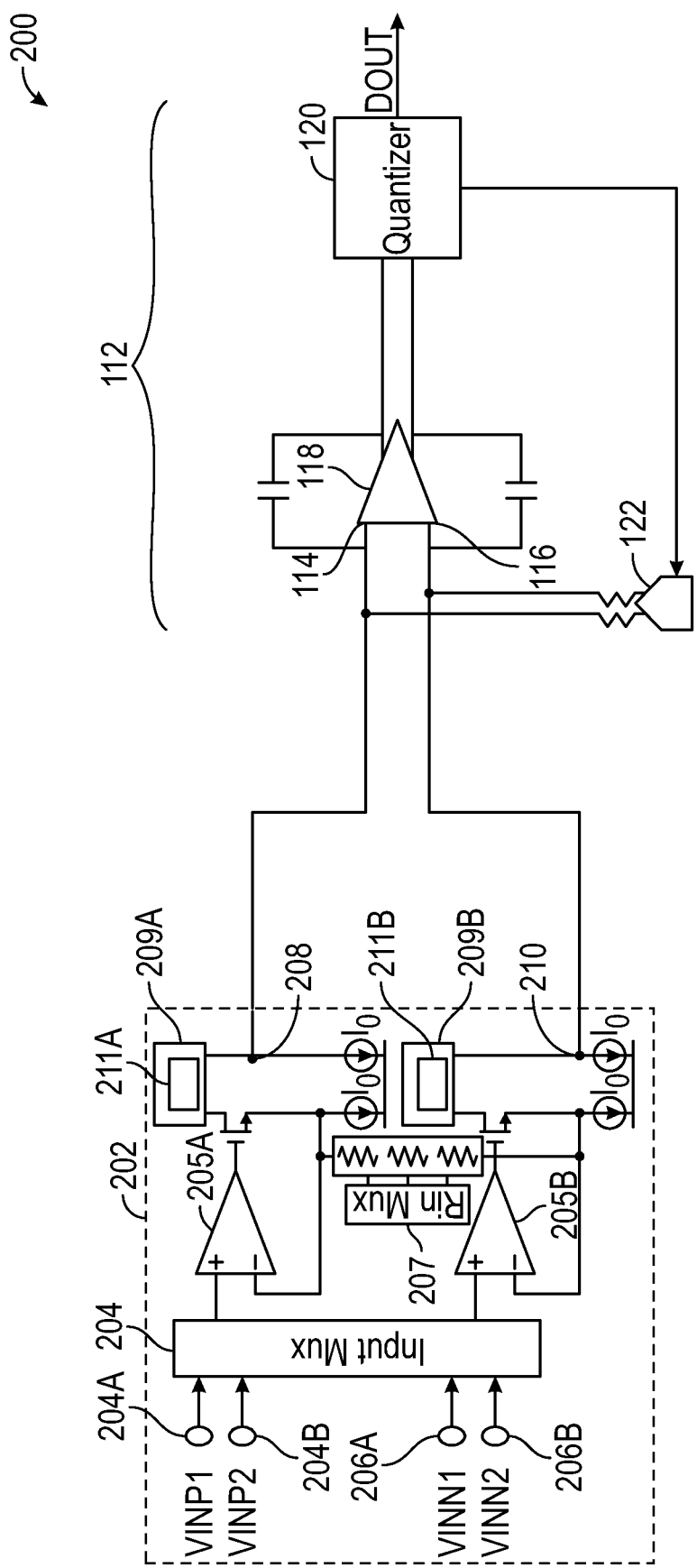
FIG. 2 is a block diagram of another example of a circuit including a gain stage with a current output coupled with a current input ADC circuit using various techniques of this disclosure.

FIG. 2 is a block diagram of another example of a circuit including a gain stage with a current output coupled with a current input ADC circuit using various techniques of this disclosure. The circuit 200 in FIG. 2 can include a gain stage 202, e.g., an instrumentation amplifier, which can be an example of the gain stage of FIG. 1. The gain stage 202 can include first input nodes 204A, 204B to receive input voltages VINP1, VINP2, respectively, and second input nodes 206A, 206B to receive input voltages VINN1, VINN2, respectively. The gain stage 202 can include a multiplexer 204 to select one of the first input nodes and one of the second input nodes, such as (VINP1, VINN1) or (VINP2, VINN2), and then output the input voltages corresponding to the selected input nodes to inputs of corresponding operational amplifiers 205A, 205B. The two operational amplifiers 205A, 205B can form a first operational amplifier stage, e.g., differential gain stage, of the gain stage 202. As seen in FIG. 2, the gain stage 202 includes only a single operational amplifier stage. A second operational amplifier stage, e.g., such as including a resistive fully differential amplifier (FDA), has been removed. The circuit 200 can form a signal chain.

A resistor multiplexer 207 can select and couple one or more resistors between the inverting terminals of the operational amplifiers 205A, 205B. In some examples, the gain stage 202 can include a current mirror stage, such as a current mirror stage that includes current mirrors 209A, 209B. The current mirrors 209A, 209B can be coupled with corresponding current output nodes of the operational amplifiers 205A, 205B, where each of the current output nodes to provide a current output. The current mirror 209A can generate a first output current at the current output node 208 and the current mirror 209B can generate a second output current at the current output node 210. In some examples, the current mirrors 209A, 209B can include corresponding filter circuits 211A, 211B, which can perform signal filtering, such as anti-aliasing. In some examples, the filter circuits 211A, 211B can include an extra pole, if needed.

The gain stage 202 can generate a current instead of a voltage at the current output nodes 208, 210. Then, one or more input nodes of a subsequent circuit, such as the input nodes 114, 116 of the ADC circuit 112, can be coupled with the current output node of the gain stage 102 and receive a current input, rather than a voltage input. In this manner, output of the first operational amplifier stage can essentially be coupled directly to the integrator circuit of the ADC circuit 112. The ADC circuit 112 was described above and, for purposes of conciseness, will not be described again.

Figure 3:
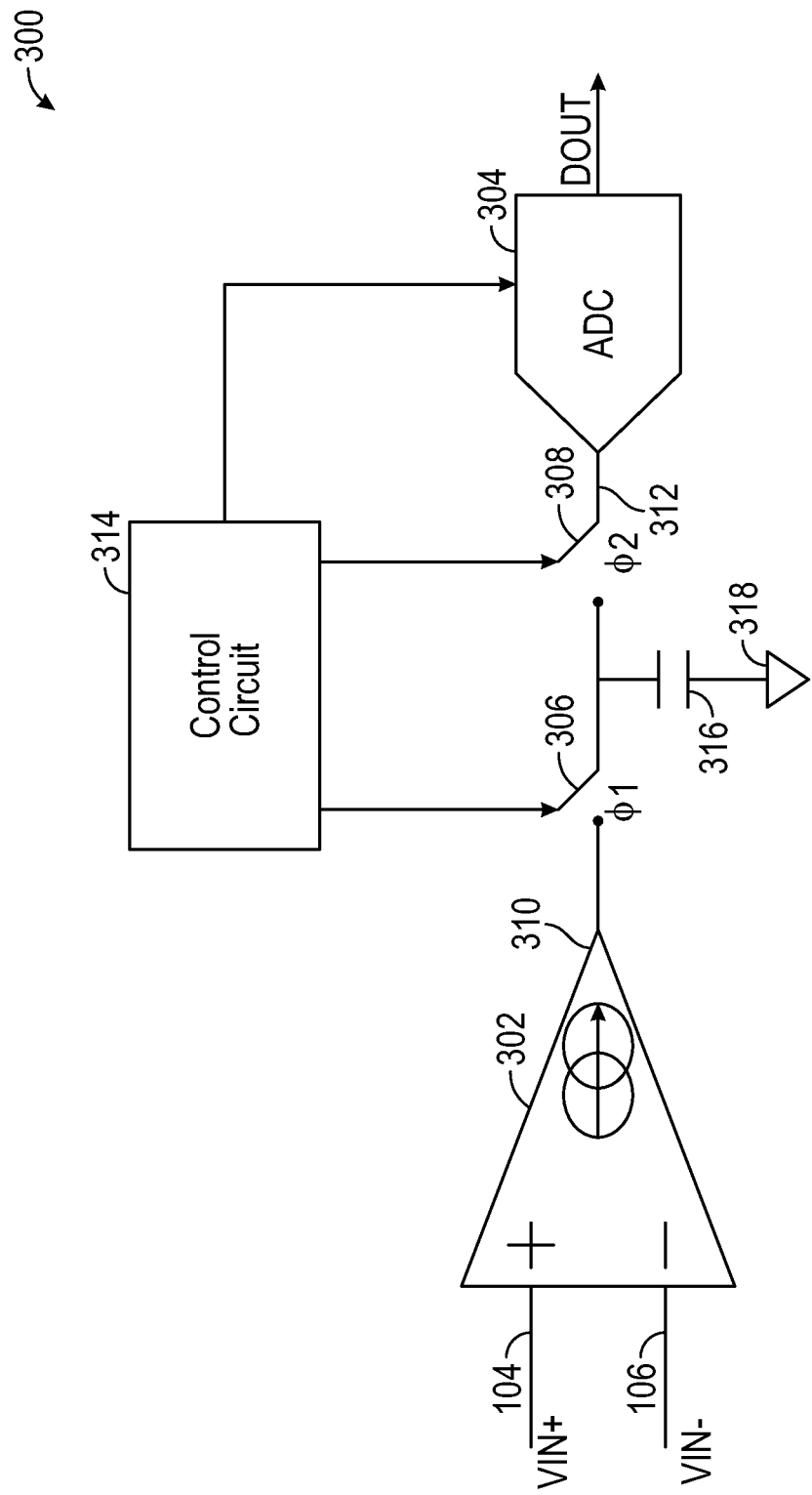
FIG. 3 is a block diagram of another example of a circuit including a gain stage with a current output coupled with a current input ADC circuit using various techniques of this disclosure.

FIG. 3 is a block diagram of another example of a circuit including a gain stage with a current output coupled with a current input ADC circuit using various techniques of this disclosure. The circuit 300 of FIG. 3 can include a gain stage 302 that can be similar to the gain stage 102 of FIG. 1, a non-limiting example of which being shown in FIG. 2 as the gain stage 202. The circuit 300 can form a signal chain.

In the example shown in FIG. 1, the ADC circuit 112 was described as a CTSD ADC circuit. However, other examples of ADC circuits can be coupled to the current output nodes of the gain stage 102. For example, the ADC circuit 304 in FIG. 3, which is an example of the ADC circuit 112 of FIG. 1, can be a continuous-time ADC (CT-ADC), such as a CTSD ADC circuit, or a discrete-time ADC (DT-ADC) circuit, such as a successive approximation register (SAR) ADC circuit.

The circuit 300 can include a pair of electronic switches 306, 308, such as transistors, coupled in series between a current output node 310 of the gain stage 302 and to an input node 312 of the ADC circuit 304. The circuit 300 can include a control circuit 314 to operate the pair of electronic switches 306, 308 in a complementary manner, such as by using two opposite timing phases 41 and 42.

In addition, the circuit 300 can include a capacitor 316 coupled between the pair of electronic switches 306, 308 and to a reference voltage 318. The capacitor 316 can receive the current output from the gain stage 302. For example, the current that is output from the gain stage 302 can charge the capacitor 316 and thus the capacitor can act as an integrator. The ADC circuit 304 can measure the integrator current in the form of a voltage. The ADC circuit 304 can generate a digital output DOUT that represents the analog input signal.

FIG. 4 is a block diagram of another example of a circuit including a gain stage with a current output coupled with a current input ADC circuit using various techniques of this disclosure. The circuit 400 can include a gain stage 402 that can be similar to the gain stage 102 of FIG. 1, a non-limiting example of which being shown in FIG. 2 as the gain stage 202. In the example shown in FIG. 4, the gain stage 402 and the ADC circuit 404 can be arranged in a single-ended configuration. The circuit 400 can form a signal chain.

The ADC circuit 404 can be a single-ended CTSD ADC circuit, for example, including an integrator circuit having an operational amplifier circuit 406 coupled in a feedback configuration using a capacitor. The ADC circuit 404 can include input nodes 408, 410. As seen in the single-ended configuration in FIG. 4, the non-inverting input node 408 can receive a current output from a current output node 411 of the gain stage 402. The inverting input node 410 can receive a common-mode voltage VCM. In addition, the ADC circuit 404 can include a quantizer circuit 412 and a digital-to-analog converter (DAC) circuit 414, such as a current DAC or resistive DAC. The ADC circuit 404 can generate a digital output DOUT that represents the analog input signal.

In some examples, the circuit 400 can include a control circuit 416 that can output one or more control signals to control various operations of the ADC circuit 404. For example, the control circuit 416 can output various control signals to the DAC circuit 414 and the quantizer circuit 412.

In some examples, the gain stage described in this disclosure can further include a voltage output node. The current output node can be coupled with a first subsequent circuit, e.g., a first ADC circuit, and the voltage output node can be coupled with a second subsequent circuit, e.g., a second ADC circuit. Then, a control circuit can control a corresponding switch to couple the current output node to the first subsequent circuit, e.g., the first ADC circuit, and/or couple the voltage output node with the second subsequent circuit, e.g., the second ADC circuit. Examples of these techniques are shown in FIGS. 5 and 6.

Figure 5:
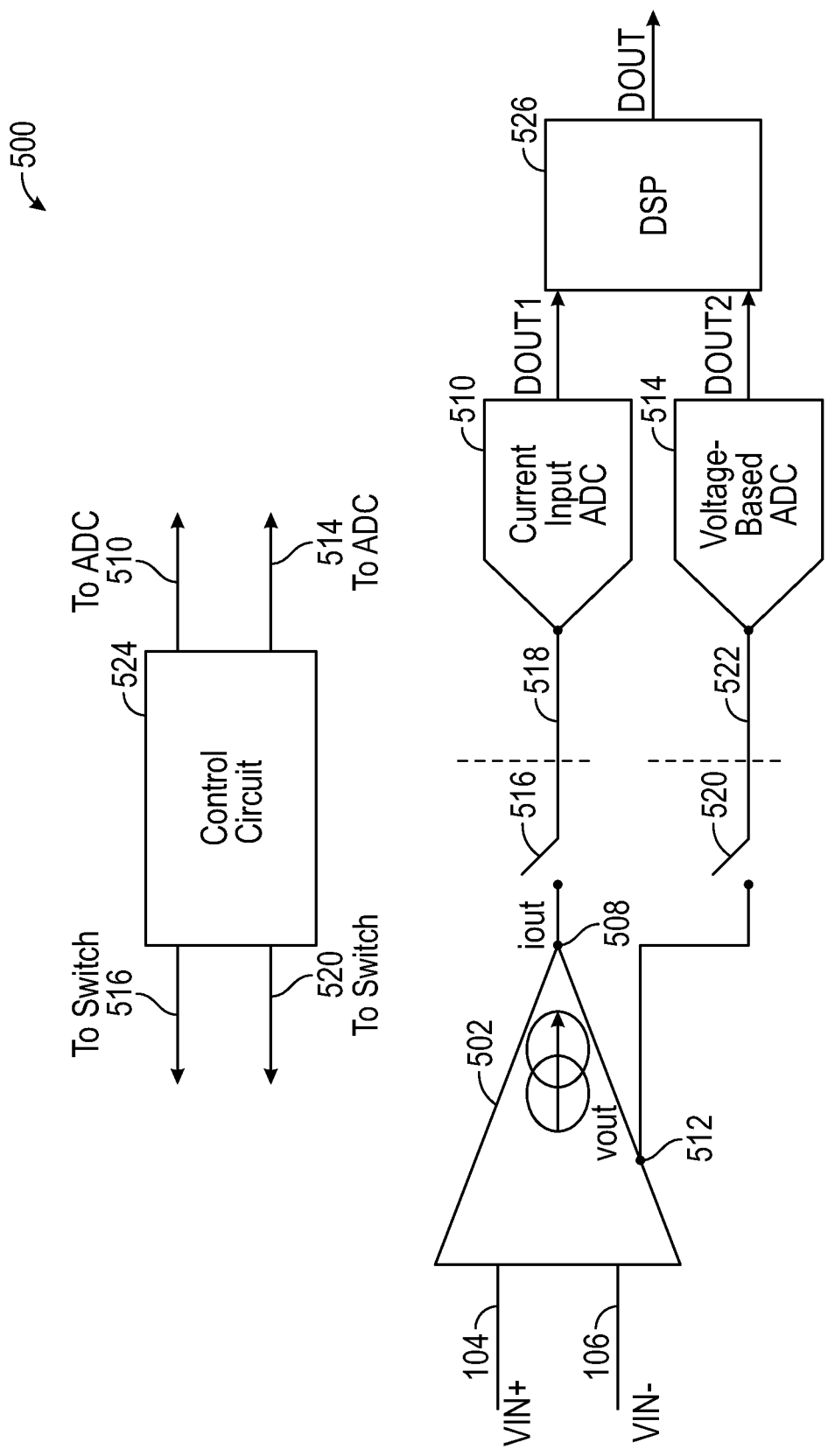
FIG. 5 is a block diagram of another example of a circuit including a gain stage with a current output coupled with a current input ADC circuit using various techniques of this disclosure.
Figure 6:
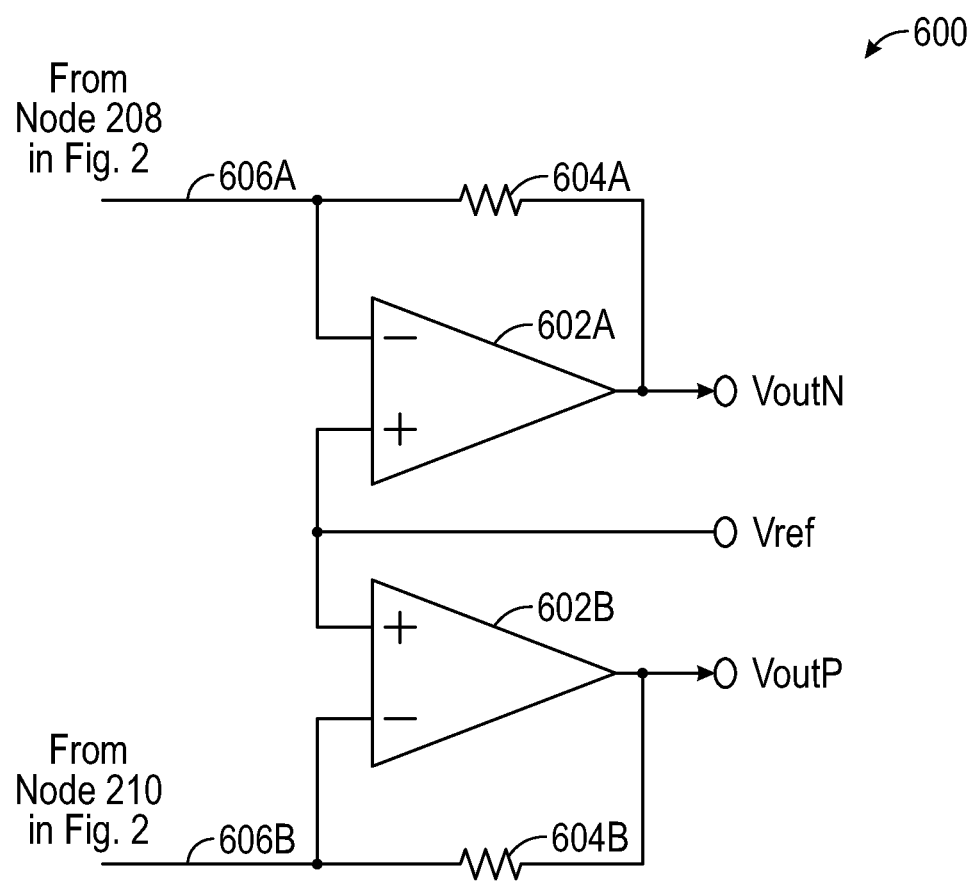
FIG. 6 is an example of a second operational amplifier stage that can be included and coupled with a voltage output node of a gain stage.

FIG. 5 is a block diagram of another example of a circuit including a gain stage with a current output coupled with a current input ADC circuit using various techniques of this disclosure. The circuit 500 can include a gain stage 502. The gain stage 502 can include an amplifier, such as an instrumentation amplifier, having a non-inverting input node 104 and an inverting input node 106. The input nodes 104, 106 can receive an input signal $V_{IN}$, such as from a sensor performing a measurement. The gain stage can apply a gain, e.g., greater than or less than zero, to the input signal to adjust a level of the input signal, e.g., amplifier or attenuate. The circuit 500 can form a signal chain.

Using various techniques described above, the gain stage 502 can generate a current instead of a voltage at one or more current output nodes, such as at the current output node 508. Then, one or more input nodes of a subsequent circuit, such as a current-input ADC circuit 510, can be coupled with the current output node 508 of the gain stage 502 and can receive a current input, rather than a voltage input. In some examples, the current-input ADC circuit 510 can include a current input continuous-time sigma-delta ADC circuit. The current-input ADC circuit 510 can generate a first digital output DOUT1.

In addition, and as mentioned above, the gain stage 502 can further include a voltage output node 512 to provide a voltage output. The second operational amplifier stage of the gain stage that was removed from the path to generate a current at the current output node 508 can be included in the path to the voltage output node 512. That is, the gain stage 502 can include a first operational amplifier stage, such as shown in FIG. 2, and a second operational amplifier stage between one or more input nodes 104, 106 and the voltage output node 512. An example of such a second operational amplifier stage is shown in FIG. 6. One or more input nodes of a subsequent circuit, such as a voltage-based ADC circuit 514, can be coupled with the voltage output node 512 of the gain stage 502 and can receive a voltage input. The voltage-based ADC circuit 510 can generate a second digital output DOUT2.

The circuit 500 can include an electronic switch 516, e.g., a transistor, coupled between the current output node 508 of the gain stage 502 and an input node 518 of the current-input ADC circuit 510. In addition, the circuit 500 can include an electronic switch 520, e.g., a transistor, coupled between the current output node 512 of the gain stage 502 and a voltage-based input node 522 of the voltage-based ADC circuit 514.

A control circuit 524 can output corresponding signals to control operation of the switches 516, 520 to couple the current output node 508 with the input node 518 of the current-input ADC circuit 510 and/or couple the voltage output node 512 with the voltage-based input node 522 of the voltage-based ADC circuit 514. In some examples, the control circuit 524 can output signals to one or both the current-input ADC circuit 510 and the voltage-based ADC circuit 514 to control various operations of those ADC circuits.

For example, in some implementations, both the current-input ADC circuit 510 and the voltage-based ADC circuit 514 can operate substantially simultaneously on the same analog input signal sample. In such an example, the control circuit can output control signals to close both the electronic switches 516, 520.

In other examples, either the current-input ADC circuit 510 or the voltage-based ADC circuit 514 can be coupled with a corresponding output node 508, 512 of the gain stage 502. In such an example, the control circuit can output control signals to close one of the electronic switches 516, 520 and open the other one.

In addition, the ADC circuit 500 can include a digital signal processor (DSP) 526 configured to receive the first digital output signal DOUT1 and/or the second digital output signal DOUT2 and generate at least one processed digital output signal DOUT. As an example, such as when the current-input ADC circuit 510 and the voltage-based ADC circuit 514 are operating substantially simultaneously on the same analog input signal sample, the digital signal processor 526 can be configured to combine the first digital output signal DOUT1 and the second digital output signal DOUT2, such that the at least one processed digital output signal DOUT is a single, combined digital output signal. That is, the first digital output signal DOUT1 and the second digital output signal DOUT2 can be recombined digitally into a single bit stream. An example of a recombination technique is described in commonly assigned U.S. Pat. No. 9,083,369 to Coln et al. and titled "Split-path data acquisition signal chain," the entire contents of which being incorporated herein by reference.

In examples in which only one of the current-input ADC circuit 510 and the voltage-based ADC circuit 514 are operating on a given analog input signal sample, the digital signal processor 526 can receive the first digital output signal DOUT1 or the second digital output signal DOUT2 and generate a corresponding processed digital output signal DOUT.

FIG. 6 is an example of a second operational amplifier stage that can be included and coupled with a voltage output node of a gain stage. The second operational amplifier stage 600, e.g., resistive fully differential amplifier, can include a pair of operational amplifiers 602A, 602B arranged in a feedback configuration using corresponding resistors 604A, 604B. The second operational amplifier stage 600 can include input nodes 606A, 606B coupled with and configured to receive input signals from nodes 208, 210 in FIG. 2, for example. In some examples, each of the input nodes 606A, 606B can be coupled with corresponding electronic switches that can be controlled by a control circuit, such as the control circuit 524 of FIG. 5.

In some examples, the input nodes 606A, 606B can be coupled with the inverting inputs of the operational amplifiers 602A, 602B and the non-inverting inputs of the operational amplifiers 602A, 602B can be coupled together and to a reference voltage VREF. The second operational amplifier stage 600 can generate outputs VOUTP, VOUTN, such as at a voltage output node, e.g., the voltage output node 512 of FIG. 5. Although shown as a differential stage, in other examples, the second operational amplifier stage 600 can be arranged in a single-ended configuration.

Figure 7:
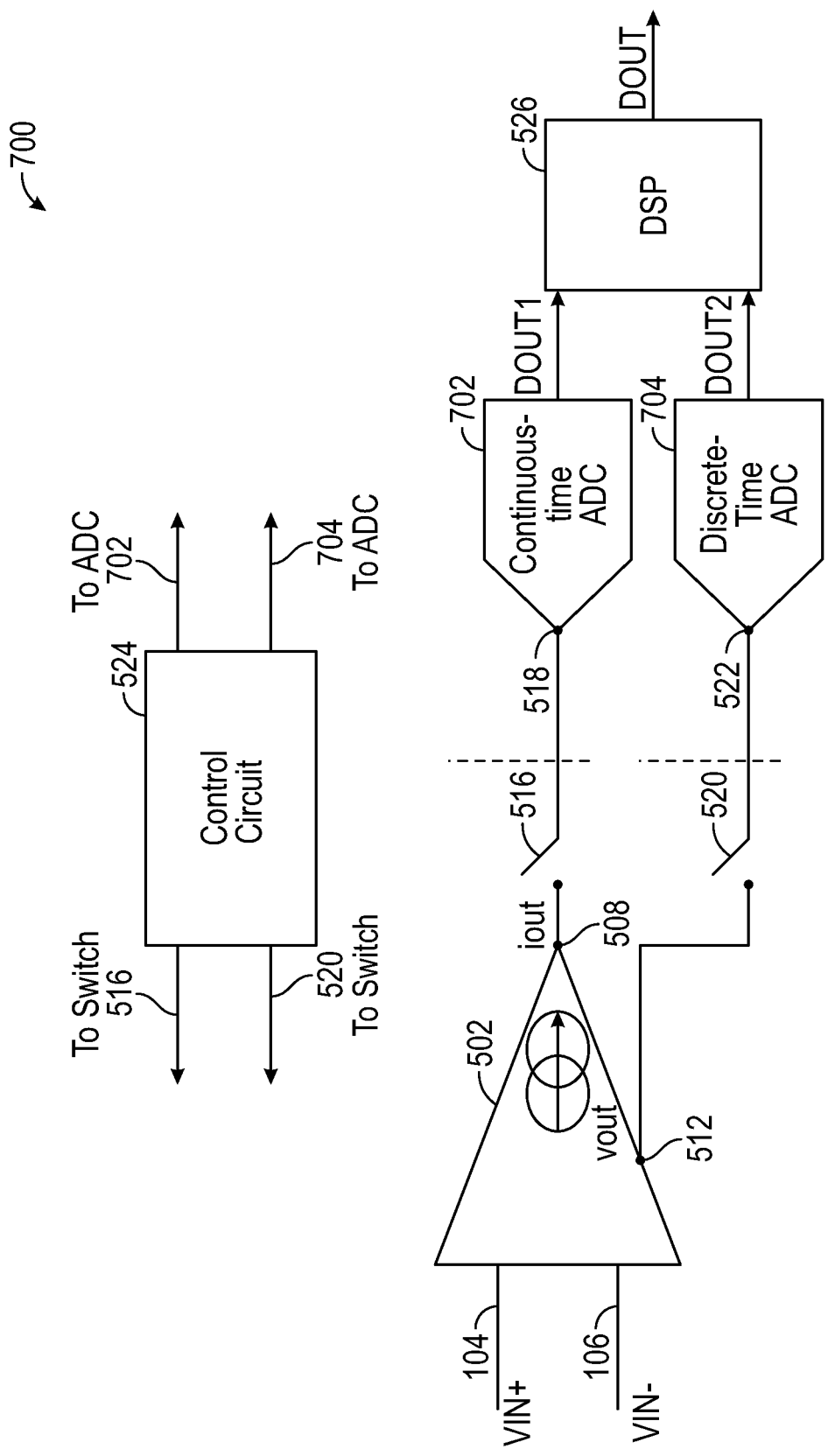
FIG. 7 is a block diagram of another example of a circuit including a gain stage with a current output coupled with a current input ADC circuit using various techniques of this disclosure.

FIG. 7 is a block diagram of another example of a circuit including a gain stage with a current output coupled with a current input ADC circuit using various techniques of this disclosure. Many of the components in FIG. 7 are similar to the components in FIG. 5 and, for purposes of conciseness, will not be described in detail again. In the circuit 700 in FIG. 7, in some examples, the first ADC circuit 702 can include a continuous-time ADC circuit, such as a sigma-delta ADC circuit, and the second ADC circuit 704 can include a discrete-time ADC circuit, such as a successive approximation register (SAR) ADC circuit, a flash ADC circuit, a sigma-delta ADC circuit, or a pipeline ADC circuit. The circuit 700 can form a signal chain.

The continuous-time ADC circuit be used for wide bandwidth AC performance and the discrete-time ADC circuit can be used for narrow bandwidth DC performance. As such, both high DC accuracy and high AC accuracy can be achieved.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:
1. A circuit comprising:
   a gain stage including:
      an input node to receive an input signal;
      a first operational amplifier stage coupled between the input node and a current output node, the current output node to provide a current output;

a current mirror stage coupled with an output of the first operational amplifier stage, the current output node coupled with the current mirror stage; and an analog-to-digital converter (ADC) circuit having an input node coupled with the current output node of the gain stage, the input node to receive a current input.

2. The circuit of claim 1, wherein the gain stage includes an instrumentation amplifier.

3. The circuit of claim 1, wherein the ADC circuit includes a continuous-time sigma-delta ADC circuit.

4. The circuit of claim 1, wherein the ADC circuit includes a discrete-time ADC circuit.

5. The circuit of claim 1, wherein the gain stage and the ADC circuit are arranged in a single-ended configuration.

6. The circuit of claim 1, wherein the gain stage and the ADC circuit are arranged in a differential configuration.

7. The circuit of claim 1, comprising:
a pair of electronic switches coupled in series between the current output node of the gain stage and to the input node of the ADC circuit;
a control circuit to operate the pair of electronic switches in a complementary manner; and
a capacitor coupled between the pair of electronic switches and to a reference voltage, the capacitor to receive the current output from the gain stage.

8. The circuit of claim 1, comprising:
a pair of electronic switches coupled in series between the current output node of the gain stage and to the input node of the ADC circuit;
a control circuit to operate the pair of electronic switches in a complementary manner, and
an integrator circuit including an operational amplifier coupled in series between the current output node of the gain stage and to the input node of the ADC circuit.

9. The circuit of claim 1, wherein the gain stage includes a voltage output node to provide a voltage output, and wherein the gain stage includes the first operational amplifier stage and a second operational amplifier stage between the input node and the voltage output node.

10. The circuit of claim 9, wherein the ADC circuit is a first ADC circuit, and wherein the first ADC includes a current input continuous-time sigma-delta ADC circuit, the circuit comprising:
a second ADC, wherein the second ADC circuit includes a voltage-based input node.

11. The circuit of claim 10, wherein the ADC circuit is a first ADC circuit, and wherein the first ADC circuit includes a current input continuous-time ADC circuit, the circuit comprising:
a second ADC circuit, wherein the second ADC circuit includes a discrete-time ADC circuit.

12. The circuit of claim 1, wherein the current mirror stage includes a filter circuit.

13. A method comprising:
receiving an input signal;
applying, using a gain stage, a gain to the input signal to adjust a level of the input signal;
outputting, using a current output node of the gain stage, a current representing the adjusted input signal; and
applying the current representing the adjusted input signal to an input node of an analog-to-digital converter (ADC) circuit having an input node coupled with the current output node of the gain stage, the input node to receive a current input.

14. The method of claim 13, wherein applying the current representing the adjusted input signal to the input node of an analog-to-digital converter (ADC) circuit having the input node coupled with the current output node of the gain stage, the input node to receive the current input includes:
applying the current representing the adjusted input signal to the input node of a continuous-time sigma-delta ADC circuit.

15. The method of claim 14, comprising:
coupling a capacitor between a pair of electronic switches and to a reference voltage, the capacitor to receive the current output from the gain stage;
controlling, wherein the pair of electronic switches are coupled in series between the current output node of the gain stage and to the input node of the ADC circuit; and
controlling the pair of electronic switches to operate in a complementary manner.

16. The method of claim 14, comprising:
coupling an integrator circuit including an operational amplifier in series between the current output node of the gain stage and to the input node of the ADC circuit; and
controlling a pair of electronic switches to operate in a complementary manner, wherein the pair of electronic switches are coupled in series between the current output node of the gain stage and to the input node of the ADC circuit.

17. The method of claim 14, wherein the ADC circuit is a first ADC circuit, wherein the gain stage includes a voltage output node to provide a voltage output, wherein the gain stage includes a first operational amplifier stage and a second operational amplifier stage between the input node and the voltage output node, the method comprising:
controlling a first electronic switch coupled between the current output node of the gain stage and the first ADC circuit; and
controlling a second electronic switch coupled between the voltage output node and a voltage-based input node of a second ADC circuit.

18. A circuit comprising:
a gain stage including:
an input node to receive an input signal;
a first operational amplifier stage coupled between the input node and a current output node, the current output node to provide a current output;
a current mirror stage coupled with an output of the first operational amplifier stage, the current output node coupled with the current mirror stage;
a second operational amplifier stage coupled between the current mirror stage and a voltage output node, the voltage output node to provide a voltage output;
a first analog-to-digital converter (ADC) circuit having an input node coupled with the current output node of the gain stage, the input node to receive a current input; and
a second ADC circuit having a voltage-based input node coupled with the voltage output node of the gain stage.

19. The circuit of claim 18, wherein the first ADC circuit includes a current input continuous-time ADC circuit and wherein the second ADC circuit includes a discrete-time ADC circuit.

* * * * *